(12) United States Patent  
Choi et al.

(10) Patent No.: US 8,633,058 B2
(45) Date of Patent: Jan. 21, 2014

(54) INTEGRATED CIRCUIT PACKAGING SYSTEM WITH STEP MOLD AND METHOD OF MANUFACTURE THEREOF

(75) Inventors: DaeSik Choi, Seoul (KR); Jong-Woo Ha, Seoul (KR); Seung Won Kim, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 212 days.

(21) Appl. No.: 13/052,590

(22) Filed: Mar. 21, 2011

(65) Prior Publication Data

US 2012/0241979 A1 Sep. 27, 2012

(51) Int. Cl.
*H01L 21/00* (2006.01)

(52) U.S. Cl.
USPC ............ 438/109; 438/110; 257/686; 257/777

(58) Field of Classification Search
USPC ......... 438/107, 108, 109, 110, 125, 126, 127; 257/686, 777, 787, 784
See application file for complete search history.

(56) References Cited

U.S. PATENT DOCUMENTS

| | | | |
|---|---|---|---|
| 7,115,441 B2 | 10/2006 | Choi | |
| 7,253,511 B2 | 8/2007 | Karnezos et al. | |
| 7,312,519 B2 * | 12/2007 | Song et al. | 257/686 |
| 7,550,832 B2 | 6/2009 | Weng et al. | |
| 7,582,960 B2 * | 9/2009 | Karnezos | 257/686 |
| 7,586,182 B2 * | 9/2009 | Baek et al. | 257/686 |
| 7,589,408 B2 * | 9/2009 | Weng et al. | 257/686 |
| 7,635,917 B2 | 12/2009 | Wang et al. | |
| 7,772,685 B2 * | 8/2010 | Huang et al. | 257/686 |
| 8,115,293 B2 * | 2/2012 | Moon et al. | 257/686 |
| 8,138,590 B2 * | 3/2012 | Chow et al. | 257/680 |
| 8,309,397 B2 * | 11/2012 | Shim et al. | 438/109 |

* cited by examiner

*Primary Examiner* — S. V. Clark
(74) *Attorney, Agent, or Firm* — Ishimaru & Associates LLP

(57) ABSTRACT

A method of manufacture of an integrated circuit packaging system includes: providing a substrate; connecting an integrated circuit die to the substrate, with the integrated circuit die having peripheral sides; molding a step mold covering one of the peripheral sides; attaching an intermediate die directly over the integrated circuit die, offset to one of the peripheral sides adjacent to the step mold; and directly connecting the intermediate die to the substrate.

11 Claims, 6 Drawing Sheets

INTEGRATED CIRCUIT PACKAGING SYSTEM WITH STEP MOLD AND METHOD OF MANUFACTURE THEREOF

TECHNICAL FIELD

The present invention relates generally to integrated circuit packaging system, and more particularly to an integrated circuit packaging system having step mold.

BACKGROUND ART

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner. The packaging configurations that house and protect IC require them to be made smaller and thinner as well.

In response to the demands for improved packaging, many innovative packaging designs have been conceived and brought to market. The multi-chip module has achieved a prominent role in reducing the board space used by modern electronics. Numerous packaging approaches stack multiple integrated circuit dice or packaging in packaging (PIP) or a combination. The electrical connections to each of the stacked integrated circuit require an increased amount of space. Accommodating for the increased amount of space require increase in overall size and cost.

Thus, a need still remains for an integrated circuit packaging system providing low cost manufacturing, improved yields, reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; connecting an integrated circuit die to the substrate, with the integrated circuit die having peripheral sides; molding a step mold covering one of the peripheral sides; attaching an intermediate die directly over the integrated circuit die, offset to one of the peripheral sides adjacent to the step mold; and directly connecting the intermediate die to the substrate.

The present invention provides an integrated circuit packaging system including: a substrate; an integrated circuit die connected to the substrate, with the integrated circuit die having peripheral sides; a step mold covering one of the peripheral sides; and an intermediate die attached directly over the integrated circuit die, offset to one of the peripheral sides adjacent to the step mold, with the intermediate die directly connected to the substrate.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
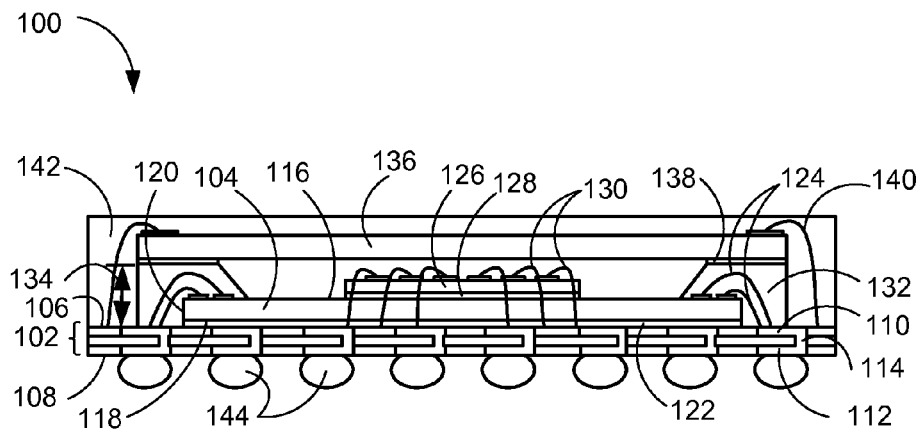
FIG. 1 is a cross-sectional view of an integrated circuit packaging system along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact between elements. The term "processing" as used herein includes deposition of material, patterning, exposure, development, etching, cleaning, molding, and/or removal of the material or as required in forming a described structure.

Figure 2:
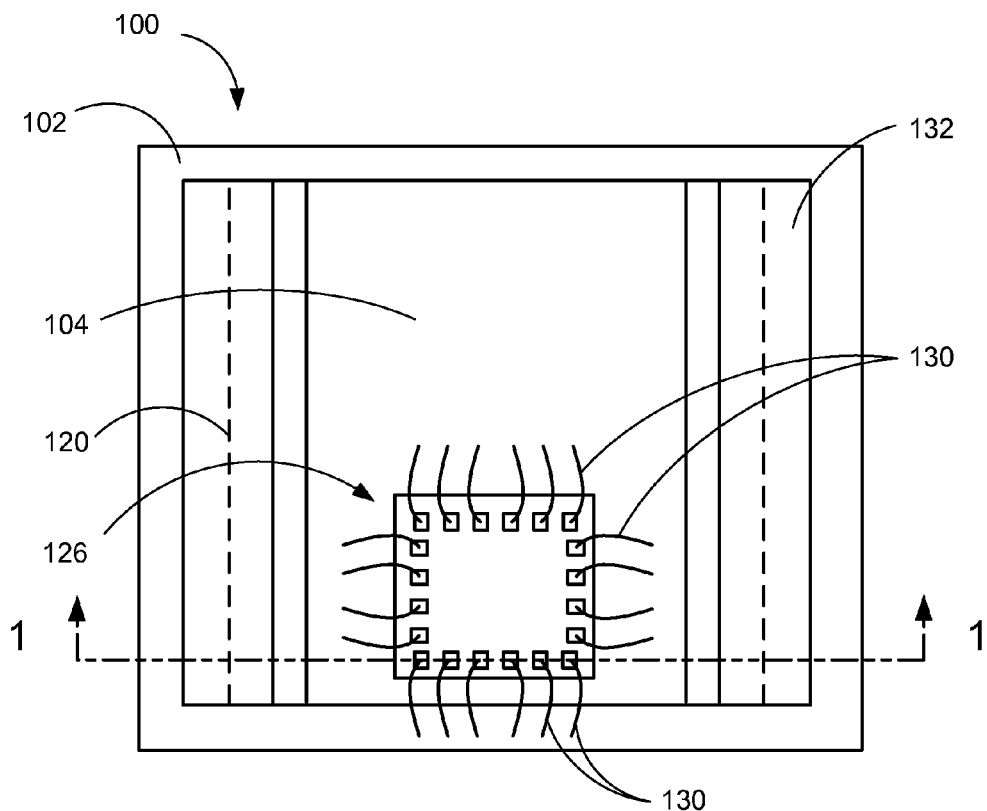
FIG. 2 is a top plan view of the integrated circuit packaging system in the first embodiment of the present invention.

Referring now to FIG. 1, therein is shown a cross-sectional view of an integrated circuit packaging system 100 along a line 1-1 of FIG. 2 in a first embodiment of the present invention. The integrated circuit packaging system 100 can have a substrate 102 and an integrated circuit die 104.

The substrate 102 is a body or base layer, onto which integrated circuits and discrete components can be attached. The substrate 102 can be many different forms, such as laminate substrate, glass, aluminum oxide, or printed circuit board (PCB). The substrate 102 can be made of conductive material or an insulator.

The substrate 102 can have a top surface 106 and a bottom surface 108. The top surface 106 and the bottom surface 108 can each be a planar surface. The top surface 106 and the bottom surface 108 can be parallel and the top surface 106 can be directly over the bottom surface 108. The substrate 102 can have discrete components, such as integrated circuits or resistors, attached on the top surface 106. The substrate 102 can have components or terminals on the bottom surface 108.

The substrate 102 can have contact pads 110 on the top surface 106. The contact pads 110 are conductive materials, such as copper or gold, or a set of layers having conductive property that can be used to relay electrical signals. For example, the contact pads 110 may relay the signal to and from the integrated circuit die 104 to other components connected to the contact pads 110.

The contact pads 110 can be on the substrate 102 or embedded in the substrate. As a specific example, the contact pads 110 can have an upper surface that is parallel to and above the top surface 106 of the substrate 102. Alternatively, the contact pads 110 can also have the upper surface coplanar with the top surface 106 of the substrate 102.

The substrate 102 can have terminals 112 on the bottom surface 108. The terminals 112 are conductive materials, such as copper or aluminum, or a set of layers having conductive property that are used to relay electrical signals. For example, the terminals 112 can relay the signals between components directly connected or coupled to the terminals 112, such as solder connections or the contact pads 110 through vias 114.

The terminals 112 can be on the substrate 102 or embedded in the substrate. More specifically, the terminals 112 can have a lower surface that is parallel to and below the bottom surface 108 of the substrate 102. Alternatively, the terminals 112 can have the lower surface coplanar with the bottom surface 108 of the substrate 102.

The substrate 102 can have the vias 114 perpendicular to the top surface 106 and the bottom surface 108 and connecting the contact pads 110 and the terminals 112. The vias 114 are conductive materials, such as copper or gold, or a set of layers having conductive property that can be used to relay electrical signals between components. For example, the vias 114 can connect the contact pads 110 to the terminals 112 to relay signals to and from the integrated circuit die 104 to components outside of the integrated circuit packaging system 100.

The integrated circuit die 104 is a semiconductive device that has active circuitry fabricated thereon. The integrated circuit die 104 can have an active side 116 having active circuitry fabricated thereon and a non-active side 118 opposite the active side 116. The integrated circuit die 104 can have peripheral sides 120.

The integrated circuit packaging system 100 can have a first adhesive layer 122 on top of the substrate 102 and the integrated circuit die 104 on top of the first adhesive layer 122. The first adhesive layer 122 is a layer of substance that provides or promotes adhesion between contacting components. The first adhesive layer 122 can be an epoxy adhesive or a double sided tape. The first adhesive layer 122 can contact the top surface 106 and the non-active side 118.

The integrated circuit packaging system 100 can have bond wires 124 directly connecting the integrated circuit die 104 to other pads on the substrate 102, the contact pads 110, or a combination thereof. The bond wires 124 are conductive wires that relay electrical signals to and from the integrated circuit die 104. The bond wires 124 can be insulated wires or bare metal wires, such as gold or copper.

The bond wires 124 can attach to the active side 116 of the integrated circuit die 104. The bond wires 124 can simultaneously attach to other pads on the substrate 102, the contact pads 110, or a combination thereof. One end of the bond wires 124 can attach to the active side 116 and the other end of the bond wires can attach to the substrate 102, the contact pads 110, or a combination thereof.

The bond wires 124 can be directly over the peripheral sides 120. The bond wires 124 can also attach to the active side 116 nearer to the peripheral sides 120 than other peripheral sides.

The integrated circuit packaging system 100 can have an intermediate die 126 over the integrated circuit die 104. The intermediate die 126 is a semiconductive device that has all or portion of an electrical circuit contained within. For example, the intermediate die 126 can be packaged integrated circuit or integrated circuits die. Also, for example, the intermediate die 126 can be a flip chip or a stacked packaging.

For illustrative purposes, the intermediate die 126 is shown in the middle of the integrated circuit die 104 and equal distance away from the peripheral sides 120. However, it is understood that the intermediate die 126 can be arranged differently. For example, the intermediate die 126 can be placed off-centered relative to the integrated circuit die 104 and be closer to one of the peripheral sides 120 than the other.

The integrated circuit packaging system 100 can have a second adhesive layer 128 on top of the integrated circuit die 104 and the intermediate die 126 on top of the second adhesive layer 128. The second adhesive layer 128 is a layer of substance that provides or promotes adhesion between contacting components. The second adhesive layer 128 can be similar to the first adhesive layer 122. For example, the second adhesive layer 128 can be acrylic or resin.

The integrated circuit packaging system 100 can have intermediate bond-wires 130 directly connecting the intermediate die 126 to other pads on the substrate 102, the contact pads 110, or a combination thereof. The intermediate bond-wires 130 are conductive wires that relay electrical signals to and from the intermediate die 126. The intermediate bond-wires 130 can be similar to the bond wires 124. For example, the intermediate bond-wires 130 can be insulated wires or bare conductive wires, such as copper or gold. The intermediate bond-wires 130 can attach to the intermediate die 126 to other pads on the substrate 102, the contact pads 110, or a combination thereof.

The integrated circuit packaging system 100 can have step molds 132. The step molds 132 are solid molded structures that are used for stacking electronic components. The step molds 132 can be made from various materials. For example, the step molds 132 can be formed by molding plastic, epoxy, or resin type of material. Also, for example, the step molds 132 can be formed by shaping ceramic, composite, or other electrically non-conductive materials.

The step molds 132 can directly contact and cover the peripheral sides 120 and portions of the active side 116 near the peripheral sides 120. The step molds 132 can encapsulate the bond wires 124 therein.

The step molds 132 can have a height 134 from the top surface 106 to the highest point of the step molds 132. The height 134 of the step molds 132 can be sufficient to provide clearance over the intermediate die 126 and the intermediate bond-wires 130. The height 134 can be greater than the sum of the thicknesses of the first adhesive layer 122, the integrated circuit die 104, the second adhesive layer 128, the intermediate die 126, and the loop height of the intermediate bond-wires 130.

It has been discovered that the present invention provides the integrated circuit packaging system 100 having lower profile. The step molds 132 having the bond wires 124 encapsulated therein give rise to the benefit by eliminating the need to secure separate loop heights for the bond wires 124. The total space, including thickness, needed for the step molds 132 and the bond wires 124 can be decreased by encapsulating the bond wires within the step molds 132.

For illustrative purposes, the step molds 132 are shown as having identical shapes and mirroring each other. However, it is understood that the step molds 132 can be different and have non-identical shapes. For example, one instance of the step molds 132 can have a slanted surface with the top of the surface leaning away from the intermediate die 126. The other instance of the step molds 132 can have a surface facing the intermediate die 126 that is perpendicular to the active side 116 of the integrated circuit die 104.

The integrated circuit packaging system 100 can have a top die 136 attached to the top of the step molds 132. The top die 136 is a semiconductive device that has active circuitry fabricated thereon. The top die 136 can be similar to the integrated circuit die 104 and the intermediate die 126. For example, the top die 136 can be a wire-bond die or a stacked packaging.

The top die 136 and the step molds 132 can be attached with a third adhesive layer 138. The third adhesive layer 138 is a layer of substance that provides or promotes adhesion between contacting components. The third adhesive layer 138 can be similar to the first adhesive layer 122 and the second adhesive layer 128. For example, the third adhesive layer 138 can be a double sided tape or acrylic.

The top die 136 can be directly connected to the substrate 102 by top bond-wires 140. The top bond-wires 140 are conductive wires that conduct electrical signals to and from the top die 136. The top bond-wires 140 can be similar to the bond wires 124 and the intermediate bond-wires 130. For example, the top bond-wires 140 can be insulated wires or bare metal wires, such as gold or copper.

For illustrative purpose, the top die 136 is shown having peripheral sides that are coplanar with the outer surfaces of the step molds 132. However, it is understood that the configuration of the top die 136 relative to the step molds 132 can be different. For example, the peripheral sides of the top die 136 and the outer surfaces of the step molds 132 can have slopes that are different from each other.

Also, for example, the peripheral sides of the top die 136 can be further in than the outer surfaces of the step molds 132 and expose a portion of the top surface of the step molds 132. For further example, the peripheral sides of the top die 136 can be further out than the outer surfaces of the step molds 132 and form an overhang with a peripheral portion of the top die 136 over the substrate 102.

The integrated circuit packaging system 100 can have an encapsulation 142. The encapsulation 142 is a structure that encapsulates or surrounds components to prevent physical damage or corrosion. The encapsulation 142 can also hold the encapsulated components in place relative to each other. The encapsulation 142 can be made of materials such as ceramic, plastic, or epoxy. The encapsulation 142 can be on top of the substrate 102 and encapsulate the top die 136, the top bond-wires 140, the step molds 132, the intermediate die 126, the intermediate bond-wires 130, the integrated circuit die 104, or a combination thereof.

For illustrative purposes, the encapsulation 142 is shown as being clear to show the arrangement of other components, such as the intermediate die 126 or the intermediate bond-wires 130. However, it is understood that the material for the encapsulation 142 may be opaque.

The integrated circuit packaging system 100 can have solder bumps 144. The solder bumps 144 are solder balls used to make connection between the integrated circuit packaging system 100 and the next level system (not shown). The solder bumps 144 can be bonded to the terminals 112 and extend below the substrate 102.

Referring now to FIG. 2, therein is shown a top plan view of the integrated circuit packaging system 100 in the first embodiment of the present invention. For illustrative purposes, the integrated circuit packaging system 100 is shown having the top die 136 of FIG. 1 and a top portion of the encapsulation 142 of FIG. 1 removed. A line 1-1 for the cross-section view of FIG. 1 is also shown.

The intermediate bond-wires 130 can electrically connect the intermediate die 126 directly to the integrated circuit die 104. The intermediate bond-wires 130 can relay signals between the integrated circuit die 104 and the intermediate die 126.

The top plan view with the top chip 136 and the top portion of the encapsulation 142 removed also shows the integrated circuit die 104 having the step molds 132 cover an opposing pair of the peripheral sides 120 and exposing another pair of the peripheral sides 120. The peripheral sides 120 exposed by the step molds 132 can directly contact the encapsulation 142.

The integrated circuit packaging system 100 can have the intermediate die 126 can be offset to one of the peripheral sides 120. The intermediate die 126 can be offset to one of the peripheral sides 120 by being attached nearer to one of the peripheral sides 120 than others. As a specific example, the intermediate die 126 can be attached closer to one of the peripheral sides 120 not covered by the step molds 132. The intermediate bond-wires 130 can be directly over the peripheral side closest to the integrated circuit die 104.

It has been discovered that the present invention provides the integrated circuit packaging system 100 that provides faster communication speed and durability. The intermediate bond-wires 130 directly connecting the intermediate die 126 to the contact pads 110 of FIG. 1, with the intermediate die 126 offset to one of the peripheral sides 120 give rise to the benefit.

Attaching the intermediate die 126 near or on one of the peripheral sides 120 decreases the length of the intermediate bond-wires 130 and also allows for direct connection to the contact pads 110. Otherwise, the intermediate die 126 would require additional connections, such as through interposers and nodes. The decrease in the length of the signal path and the decrease in connection points increase the fidelity and speed of the input and output signals. Furthermore, the decrease in the number of connection points decrease the possible failure modes and provide for increased durability.

Eliminating connection points also decreases the number of steps and the amount of material necessary to manufacture the integrated circuit packaging system 100. The decrease in the number of steps provide for the simpler manufacturing process. Also, the simpler process, along with the decrease in material necessary provide for cheaper cost in manufacturing the integrated circuit packaging system 100.

For illustrative purposes, the step molds 132 are shown covering the entire length of the peripheral sides 120. However, it is understood that the step molds 132 can be configured differently. For example, the step molds 132 can cover only a portion of the peripheral sides 120. Also, for example, the step molds 132 can have gaps therein that expose portions of the peripheral sides 120.

Figure 3:
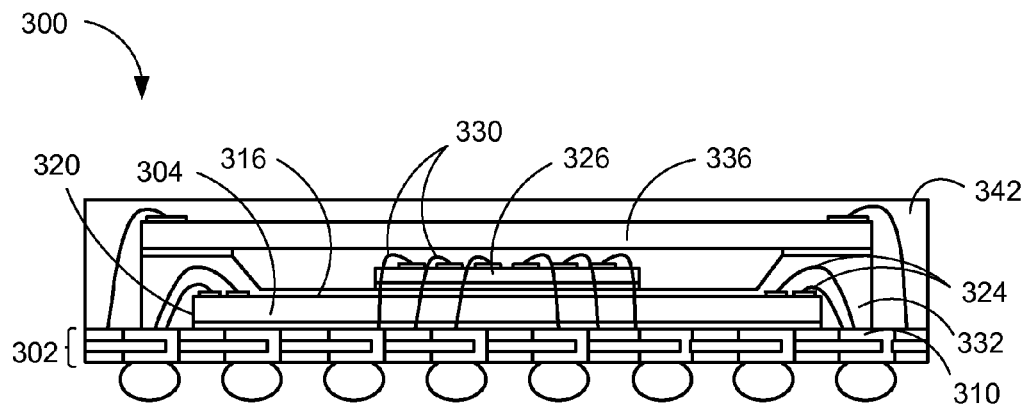
FIG. 3 is a cross-sectional view of an integrated circuit packaging system along a line 3-3 of FIG. 4 in a second embodiment of the present invention.
Figure 4:
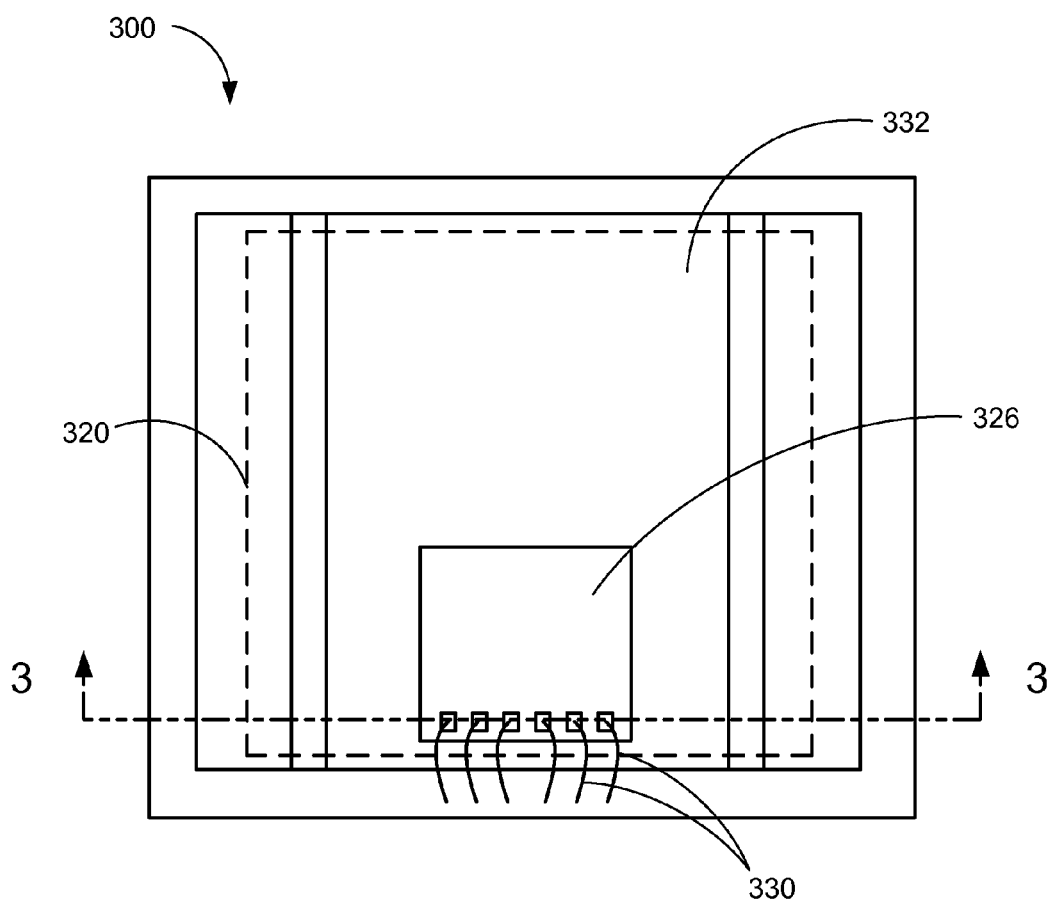
FIG. 4 is a top plan view of the integrated circuit packaging system in a second embodiment of the present invention.

Referring now to FIG. 3, therein is shown a cross-sectional view of an integrated circuit packaging system 300 along line 3-3 of FIG. 4 in a second embodiment of the present invention. The integrated circuit packaging system 300 can have a substrate 302 and an integrated circuit die 304.

The substrate 302 is a body or base layer, onto which other layers and components can be attached. The substrate 302 can be many different forms, such as laminate substrate, glass, aluminum oxide, or printed circuit board (PCB). The substrate 302 can be made of conductive material or an insulator.

The substrate 302 can have contact pads 310 on the top surface. The contact pads 310 are conductive materials, such as copper or gold, or a set of layers having conductive property that can be used to relay electrical signals. For example, the contact pads 310 can relay the signal to and from the integrated circuit die 304 to other components connected to the contact pads 310.

The contact pads 310 can be on the substrate 302 or embedded in the substrate. As a specific example, the contact pads 310 can have an upper surface that is parallel to and above the top surface of the substrate 302. Alternatively, the contact pads 310 can also have the upper surface coplanar with the top surface of the substrate 302.

The integrated circuit die 304 is a semiconductive device that has active circuitry fabricated thereon. The integrated circuit die 304 can have an active side 316 having active circuitry fabricated thereon. The integrated circuit die 304 can have peripheral sides 320.

The integrated circuit packaging system 300 can have bond wires 324 directly connecting the integrated circuit die 304 to other pads on the substrate 302, the contact pads 310, or a combination thereof. The bond wires 324 are conductive wires that relay electrical signals to and from the integrated circuit die 304. The bond wires 324 can be insulated wires or bare metal wires, such as gold or copper.

The bond wires 324 can attach to the active side 316 of the integrated circuit die 304. The bond wires 324 can simultaneously attach to other pads on the substrate 302, the contact pads 310, or a combination thereof. One end of the bond wires 324 can attach to the active side 316 and the other end of the bond wires can attach to other pads on the substrate 302, the contact pads 310, or a combination thereof.

The bond wires 324 can be over the peripheral sides 320. The bond wires 324 can also attach to the active side 316 nearer to one of the peripheral sides 320 than other peripheral sides.

The integrated circuit packaging system 300 can have an intermediate die 326 over the integrated circuit die 304. The intermediate die 326 is a semiconductive device that has active circuitry fabricated thereon. For example, the intermediate die 326 can be an integrated circuit die or a flip chip.

For illustrative purposes, the intermediate die 326 is shown in the middle of the integrated circuit die 304 and equal distance away from the peripheral sides 320. However, it is understood that the intermediate die 326 can be arranged differently. For example, the intermediate die 326 can be placed off-centered relative to the integrated circuit die 304 and be closer to one of the peripheral sides 320 than the other.

The integrated circuit packaging system 300 can have intermediate bond-wires 330 directly connecting the intermediate die 326 to other pads on the substrate 302, the contact pads 310, or a combination thereof. The intermediate bond-wires 330 are conductive wires that relay electrical signals to and from the integrated circuit die 304. The intermediate bond-wires 330 can be similar to the bond wires 324. For example, the intermediate bond-wires 330 can be insulated wires or bare conductive wires, such as copper or aluminum.

One end of the intermediate bond-wires 330 can attach to the intermediate die 326. The other end of the intermediate bond-wires 330 can attach to other pads on the substrate 302, the contact pads 310, or a combination thereof.

The integrated circuit packaging system 300 can have a step mold 332. The step mold 332 is a solid molded structure that is used for stacking electronic components. The step mold 332 can be made from various materials. For example, the step mold 332 can be formed by molding plastic, epoxy, or resin type of material. Also, for example, the step mold 332 can be formed by shaping ceramic, composite, or other electrically non-conductive materials.

The step mold 332 can directly contact and cover the peripheral sides 320 and the active side 316. The step mold 332 can encapsulate the bond wires 324 therein.

It has been discovered that the present invention provides the integrated circuit packaging system 300 having increased durability and weight bearing capacity. The step mold 332 gives rise to the benefit. The continuous shape of the step mold 332 can allow for weight to be distributed over greater surface area. The step mold 332 can thusly increase the durability and the weight bearing capacity, which allows for bigger and heavier components to be stacked above the integrated circuit die 304.

For illustrative purposes, the step mold 332 is shown as having identical shapes on each of the proximate ends that mirror each other. However, it is understood that the step mold 332 can be different and have non-symmetrical shape. For example, one end of the step mold 332 can have a slanted surface with the top of the surface leaning away from the intermediate die 326. The other end of the step mold 332 can have a surface facing the intermediate die 326 that is perpendicular to the active side 316 of the integrated circuit die 304.

The integrated circuit packaging system 300 can have a top die 336 attached to the top of the step mold 332. The top die 336 is a semi-conductive device that has active circuitry fabricated thereon. The top die 336 can be similar to the integrated circuit die 304 and the intermediate die 326. For example, the top die 336 can be an integrated circuit die or an integrated circuit package.

For illustrative purpose, the top die 336 is shown having peripheral sides that are coplanar with the outer surfaces of the step mold 332. However, it is understood that the configuration of the top die 336 relative to the step mold 332 can be different. For example, the peripheral sides of the top die 336 and the outer surfaces of the step mold 332 can have slopes that are different from each other.

Also, for example, the peripheral sides of the top die 336 can be further in than the outer surfaces of the step mold 332 and expose a portion of the top surface of the step mold 332. For further example, the peripheral sides of the top die 336 can be further out than the outer surfaces of the step mold 332 and form an overhang with a peripheral portion of the top die 336 over the substrate 302.

The integrated circuit packaging system 300 can have an encapsulation 342. The encapsulation 342 is a structure that encapsulates or surrounds components to prevent physical damage or corrosion. The encapsulation 342 can also hold the encapsulated components in place relative to each other. The encapsulation 342 can be made of materials such as ceramic, plastic, or epoxy. The encapsulation 342 can be on top of the substrate 302 and encapsulate the top die 336, the step mold 332, the intermediate die 326, the intermediate bond-wires 330, the integrated circuit die 304, or a combination thereof.

Referring now to FIG. 4, therein is shown a top plan view of the integrated circuit packaging system 300 in a second embodiment of the present invention. For illustrative purposes, the integrated circuit packaging system 300 is shown having the top die 336 of FIG. 3 and a top portion of the encapsulation 342 of FIG. 3 removed. A line 3-3 for the cross-section view of FIG. 3 is also shown.

The step mold 332 can cover all of the peripheral sides 320. The step mold 332 can encapsulate the integrated circuit die 304 of FIG. 3 and the bond wires 324 of FIG. 3. The step mold 332 can be encapsulated by the encapsulation.

The integrated circuit packaging system 300 can have the intermediate die 326 can be offset to one of the peripheral sides 320. The intermediate die 326 can be offset to one of the peripheral sides 320 by being attached nearer to one of the peripheral sides 320 adjacent to and between the portions of the step mold 332 used for support. As a specific example, the intermediate die 326 can be attached closer to the peripheral side appearing on the bottom of FIG. 4. The intermediate bond-wires 330 can be directly over the peripheral side nearest to the integrated circuit die 304.

For illustrative purposes, the step mold 332 are shown covering the entire length of the peripheral sides 320 and the entirety of the active side 316 of FIG. 3. However, it is understood that the step mold 332 can be configured differently. For example, the step mold 332 can cover only a portion of the peripheral sides 320. Also, for example, the step mold 332 can have gaps therein that expose portions of the peripheral sides 320, the active side 316, or a combination thereof.

Figure 5:
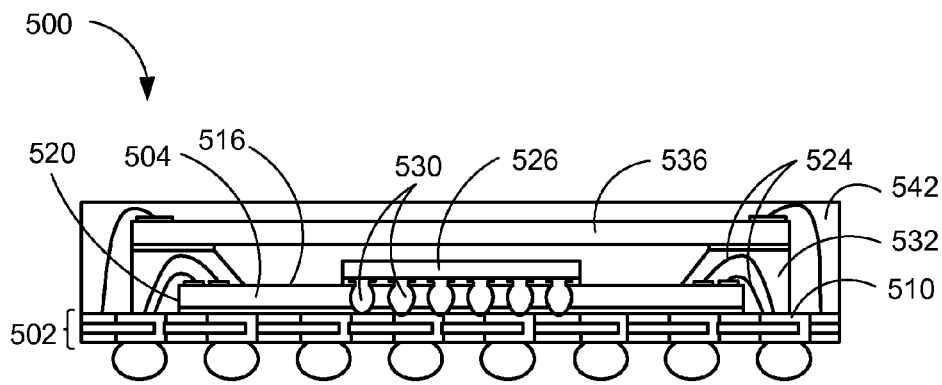
FIG. 5 is a cross-sectional view of an integrated circuit packaging system along a line 5-5 of FIG. 6 in a third embodiment of the present invention.
Figure 6:
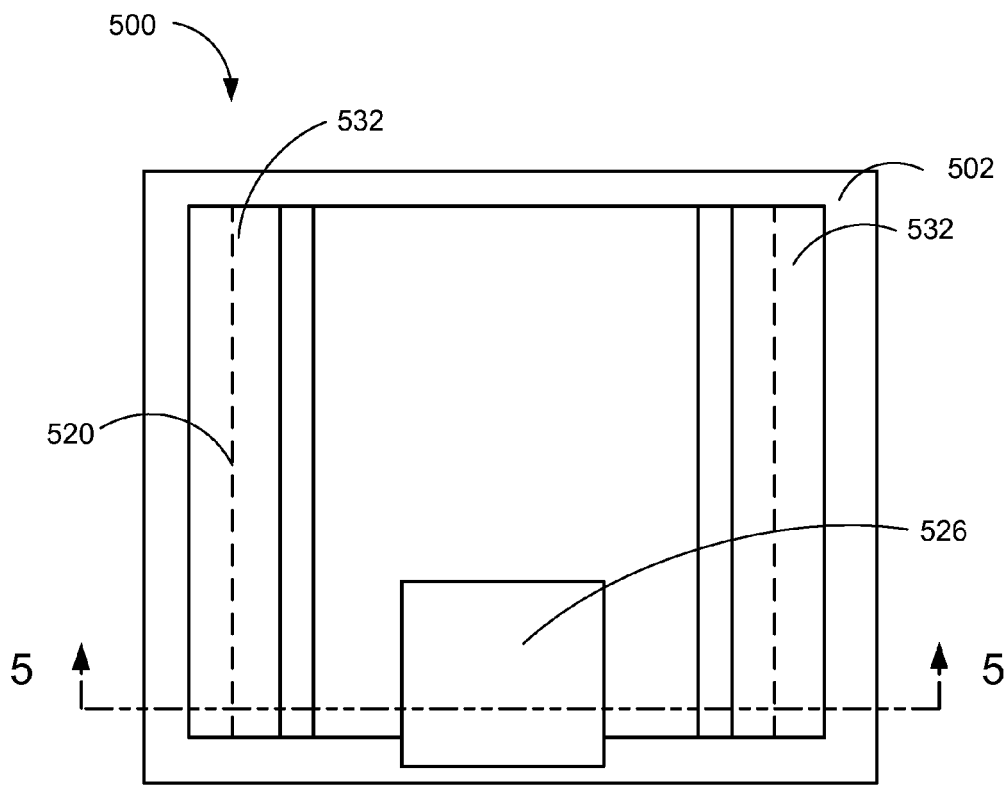
FIG. 6 is a top plan view of the integrated circuit packaging system in a third embodiment of the present invention.

Referring now to FIG. 5, therein is shown a cross-sectional view of an integrated circuit packaging system 500 along line 5-5 of FIG. 6 in a third embodiment of the present invention. The integrated circuit packaging system 500 can have a substrate 502 and an integrated circuit die 504.

The substrate 502 is a body or base layer, onto which other layers and components can be attached. The substrate 502 can be many different forms, such as laminate substrate, glass, aluminum oxide, or printed circuit board (PCB). The substrate 502 can be made of conductive material or an insulator.

The substrate 502 can have contact pads 510 on the top surface. The contact pads 510 are conductive materials, such as copper or gold, or a set of layers having conductive property that can be used to relay electrical signals between components. For example, the contact pads 510 can relay the signal to and from the integrated circuit die 504 to other components connected to the contact pads 510.

The contact pads 510 can be on the substrate 502 or embedded in the substrate. As a specific example, the contact pads 510 can have an upper surface that is parallel to and above the top surface of the substrate 502. Alternatively, the contact pads 510 can also have the upper surface coplanar with the top surface of the substrate 502.

The integrated circuit die 504 is a semi-conductive device that has active circuitry fabricated thereon. The integrated circuit die 504 can have an active side 516 having active circuitry fabricated thereon. The integrated circuit die 504 can have peripheral sides 520.

The integrated circuit packaging system 500 can have bond wires 524 directly connecting the integrated circuit die 504 to other pads on the substrate 502, the contact pads 510, or a combination thereof. The bond wires 524 are conductive wires that relay electrical signals to and from the integrated circuit die 504. The bond wires 524 can be insulated wires or bare metal wires, such as gold or copper.

The bond wires 524 can attach to the active side 516 of the integrated circuit die 504. The bond wires 524 can simultaneously attach to other pads on the substrate 502, the contact pads 510, or a combination thereof. One end of the bond wires 524 can attach to the active side 516 and the other end of the bond wires can attach to the substrate 502, the contact pads 510, or a combination thereof.

The bond wires 524 can be over the peripheral sides 520. The bond wires 524 can also attach to the active side 516 nearer to one of the peripheral sides 520 than other peripheral sides.

The integrated circuit packaging system 500 can have a flip chip 526 directly over the integrated circuit die 504. The flip chip 526 is a semi-conductive device that has active circuitry fabricated thereon and uses solder to directly connect to other components.

For illustrative purposes, the flip chip 526 is shown in the middle of the integrated circuit die 504 and equal distance away from the peripheral sides 520. However, it is understood that the flip chip 526 can be arranged differently. For example, the flip chip 526 can be placed off-centered relative to the integrated circuit die 504 and be closer to one of the peripheral sides 520 than the other.

The flip chip 526 can have interconnecting solder-bumps 530 underneath, directly connecting the flip chip 526 to other pads on the substrate 502, the contact pads 510, or a combination thereof. The interconnecting solder-bumps 530 are solder balls that relay electrical signals to and from the integrated circuit die 504. For example, the interconnecting solder-bumps 530 can be lead or RoHS compliant material.

The integrated circuit packaging system 500 can have step molds 532. The step molds 532 are solid molded structures that are used for stacking electronic components. The step molds 532 can be made from various materials. For example, the step molds 532 can be formed by molding plastic, epoxy, or resin type of material. Also, for example, the step molds 532 can be formed by shaping ceramic, composite, or other electrically non-conductive materials.

The step molds 532 can directly contact and cover the peripheral sides 520 and portions of the active side 516. The step molds 532 can encapsulate the bond wires 524 therein.

It has been discovered that the present invention provides the integrated circuit packaging system 500 having increased durability and weight bearing capacity. The step molds 532 gives rise to the benefit. The continuous shape of the step molds 532 can allow for weight to be distributed over greater surface area. The step molds 532 can thusly increase the durability and the weight bearing capacity, which allows for bigger and heavier components to be stacked above the integrated circuit die 504.

For illustrative purposes, the step molds 532 are shown as having identical shapes and mirroring each other. However, it is understood that the step molds 532 can be different. For example, one instance of the step molds 532 can have a slanted surface with the top of the surface leaning away from the flip chip 526. The other instance of the step molds 532 can have a surface facing the flip chip 526 that is perpendicular to the active side 516 of the integrated circuit die 504.

The integrated circuit packaging system 500 can have a top die 536 attached to the top of the step molds 532. The top die 536 is a semi-conductive device that has active circuitry fabricated thereon. The top die 536 can be similar to the integrated circuit die 504 and the flip chip 526. For example, the top die 536 can be an integrated circuit die or another flip chip.

For illustrative purpose, the top die 536 is shown having peripheral sides that are coplanar with the outer surfaces of the step molds 532. However, it is understood that the configuration of the top die 536 relative to the step molds 532 can be different. For example, the peripheral sides of the top die 536 and the outer surfaces of the step molds 532 can have slopes that are different from each other.

Also, for example, the peripheral sides of the top die 536 can be further in than the outer surfaces of the step molds 532 and expose a portion of the top surface of the step molds 532. For further example, the peripheral sides of the top die 536 can be further out than the outer surfaces of the step molds 532 and form an overhang with a peripheral portion of the top die 536 over the substrate 502.

The integrated circuit packaging system 500 can have an encapsulation 542. The encapsulation 542 is a structure that encapsulates or surrounds components to prevent physical damage or corrosion. The encapsulation 542 can also hold the encapsulated components in place relative to each other. The encapsulation 542 can be made of materials such as ceramic, plastic, or epoxy. The encapsulation 542 can be on top of the substrate 502 and encapsulate the top die 536, the step molds 532, the flip chip 526, the interconnecting solder-bumps 530, the integrated circuit die 504, or a combination thereof.

Referring now to FIG. 6, therein is shown a top plan view of the integrated circuit packaging system 500 in a third embodiment of the present invention. For illustrative purposes, the integrated circuit packaging system 500 is shown having with the top die 536 of FIG. 5 and a top portion of the encapsulation removed. A line 5-5 for the cross-section view of FIG. 5 is also shown.

The step molds 532 can cover an opposing pair of the peripheral sides 520 and expose another opposing pair of the peripheral sides 520. The peripheral sides 520 exposed by the step molds can directly contact the encapsulation 542 of FIG. 5.

The integrated circuit packaging system 500 can have the flip chip 526 offset to one of the peripheral sides 520. The flip chip 526 can be offset to one of the peripheral sides 520 by being attached nearer to one of the peripheral sides 520 than others.

As a specific example, the flip chip 526 can be attached over one of the peripheral sides 520 not covered by the step molds 532. A portion of the flip chip 526 can create an overhang over the substrate 502. The interconnecting solder-bumps 530 of FIG. 5 can be directly under the flip chip 526 and connect the flip chip 526 to the integrated circuit die 504.

The interconnecting solder-bumps can also be under overhanging portion of the flip chip 526 and connect the flip chip 526 to the contact pads 510.

It has been discovered that the present invention provides the integrated circuit packaging system 500 having lower profile and increased flexibility. The step molds 532 give rise to the benefit by eliminating the need for separate spacers.

Since no additional spacers are needed, the integrated circuit packaging system can have lower profile using the step molds 532. Also, molding the step molds 532 allows for custom shapes and sizes in the support structure. The customized shape of the step molds 532 can accommodate wider varieties of circuits and components in the stacking configuration.

For illustrative purposes, the step molds 532 are shown covering the entire length of the peripheral sides 520. However, it is understood that the step molds 532 can be configured differently. For example, the step molds 532 can cover only a portion of the peripheral sides 520. Also, for example, the step molds 532 can have gaps therein that expose portions of the peripheral sides 520.

Figure 7:
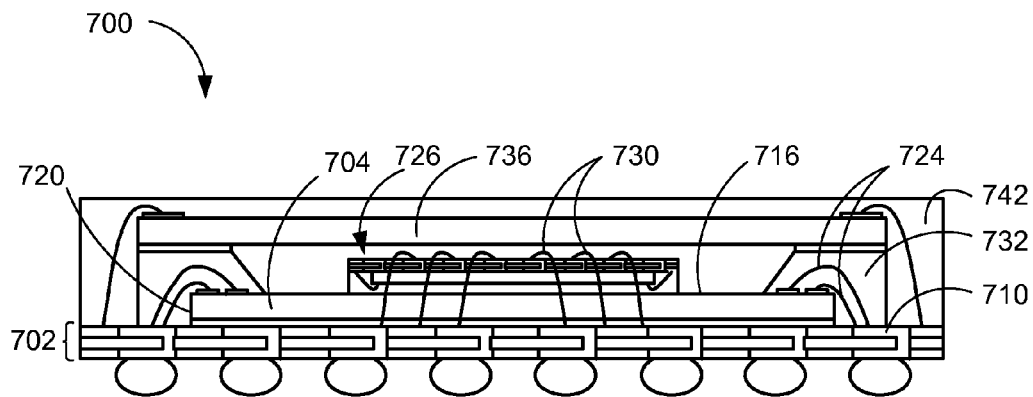
FIG. 7 is a cross-sectional view of an integrated circuit packaging system along a line 7-7 of FIG. 8 in a fourth embodiment of the present invention.
Figure 8:
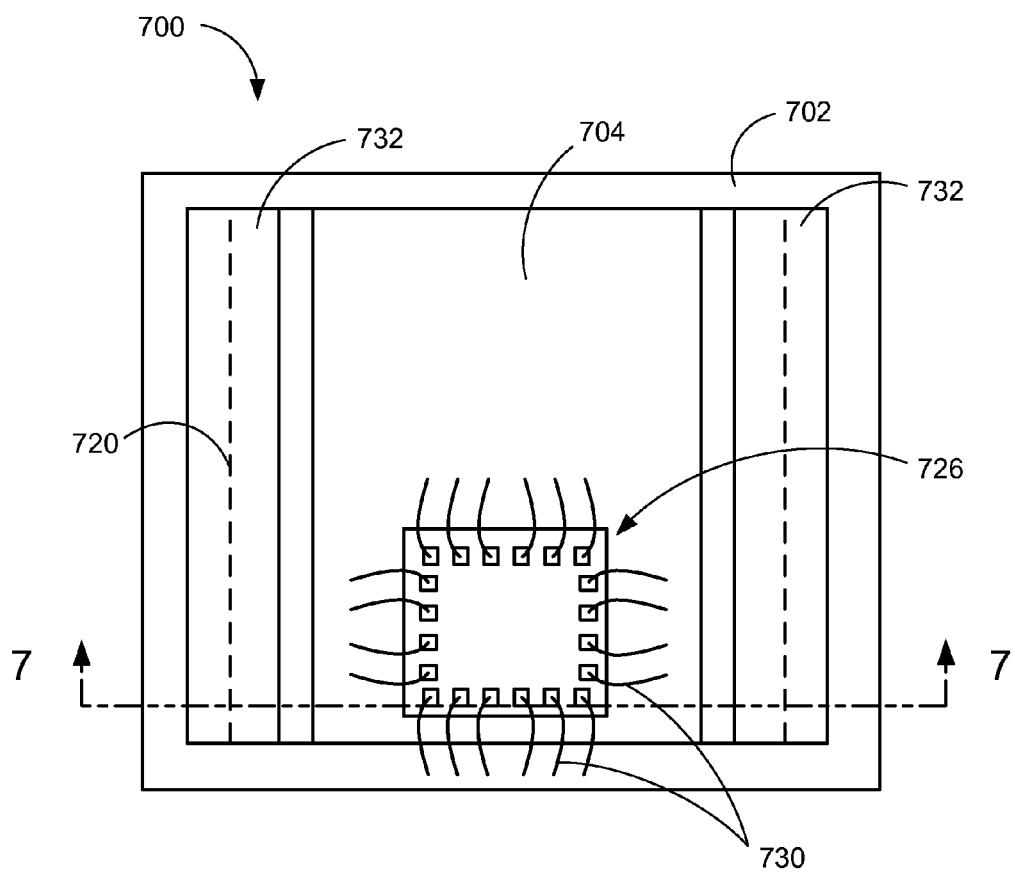
FIG. 8 is a top plan view of the integrated circuit packaging system in a fourth embodiment of the present invention.

Referring now to FIG. 7, therein is shown a cross-sectional view of an integrated circuit packaging system 700 along line 7-7 of FIG. 8 in a fourth embodiment of the present invention. The integrated circuit packaging system 700 can have a substrate 702 and an integrated circuit die 704.

The substrate 702 is a body or base layer, onto which other layers and components can be attached. The substrate 702 can be many different forms, such as laminate substrate, glass, aluminum oxide, or printed circuit board (PCB). The substrate 702 can be made of conductive material or an insulator.

The substrate 702 can have contact pads 710 on the top surface. The contact pads 710 are conductive materials, such as copper or gold, or a set of layers having conductive property that can be used to relay electrical signals. For example, the contact pads 710 can relay the signal to and from the integrated circuit die 704 to other components connected to the contact pads 710.

The contact pads 710 can be on the substrate 702 or embedded in the substrate. As a specific example, the contact pads 710 can have an upper surface that is parallel to and above the top surface of the substrate 702. Alternatively, the contact pads 710 can also have the upper surface coplanar with the top surface of the substrate 702.

The integrated circuit die 704 is a semiconductive device that has active circuitry fabricated thereon. The integrated circuit die 704 can have an active side 716 having active circuitry fabricated thereon. The integrated circuit die 704 can have peripheral sides 720.

The integrated circuit packaging system 700 can have bond wires 724 directly connecting the integrated circuit die 704 to other pads on the substrate 702, the contact pads 710, or a combination thereof. The bond wires 724 are conductive wires that relay electrical signals to and from the integrated circuit die 704. The bond wires 724 can be insulated wires or bare metal wires, such as gold or copper.

The bond wires 724 can attach to the active side 716 of the integrated circuit die 704. The bond wires 724 can simultaneously attach to other pads on the substrate 702, the contact pads 710, or a combination thereof. One end of the bond wires 724 can attach to the active side 716 and the other end of the bond wires can attach to other pads on the substrate 702, the contact pads 710, or a combination thereof.

The bond wires 724 can be over the peripheral sides 720. The bond wires 724 can also attach to the active side 716 nearer to the peripheral sides 720 than other peripheral sides.

The integrated circuit packaging system 700 can have a package 726 directly over the integrated circuit die 704. The package 726 is a device packaging that contains a semi-conductive device. The package 726 can have a substrate, a chip, wires, and encapsulation therein.

For illustrative purposes, the package 726 is shown in the middle of the integrated circuit die 704 and equal distance away from the peripheral sides 720 with the encapsulation portion on the bottom and the substrate portion on top. However, it is understood that the package 726 can be arranged differently. For example, the package 726 can be placed off-centered relative to the integrated circuit die 704 and be closer to one of the peripheral sides 720 than the other. Also, for example, the package 726 can have the substrate portion on the bottom and the encapsulation portion on top.

The integrated circuit packaging system 700 can have the intermediate bond-wires 730 directly connecting the package 726 to other pads on the substrate 702, the contact pads 710, or a combination thereof. The intermediate bond-wires 730 are conductive wires that relay electrical signals to and from the integrated circuit die 704. The intermediate bond-wires 730 can be similar to the bond wires 724. For example, the intermediate bond-wires 730 can be insulated wires or bare conductive wires, such as copper or aluminum.

The integrated circuit packaging system 700 can have step molds 732. The step molds 732 are solid molded structures that are used for stacking electronic components. The step molds 732 can be made from various materials. For example, the step molds 732 can be formed by molding plastic, epoxy, or resin type of material. Also, for example, the step molds 732 can be formed by shaping ceramic, composite, or other electrically non-conductive materials.

The step molds 732 can directly contact and cover the peripheral sides 720 and portions of the active side 716. The step molds 732 can encapsulate the bond wires 724 therein.

For illustrative purposes, the step molds 732 are shown as having identical shapes on each of the proximate ends that mirror each other. However, it is understood that the step molds 732 can be different. For example, one instance of the step molds 732 can have a slanted surface with the top of the surface leaning away from the package 726. The other instance of the step molds 732 can have a surface facing the package 726 that is perpendicular to the active side 716 of the integrated circuit die 704.

The integrated circuit packaging system 700 can have a top die 736 attached to the top of the step molds 732. The top die 736 is a semi-conductive device that has all or portion of an electrical circuit contained within. The top die 736 can be similar to the integrated circuit die 704 and the package 726. For example, the top die 736 can be an integrated circuit die or an integrated circuit package.

For illustrative purpose, the top die 736 is shown having peripheral sides that are coplanar with the outer surfaces of the step molds 732. However, it is understood that the configuration of the top die 736 relative to the step molds 732 can be different. For example, the peripheral sides of the top die 736 and the outer surfaces of the step molds 732 can have slopes that are different from each other.

Also, for example, the peripheral sides of the top die 736 can be further in than the outer surfaces of the step molds 732 and expose a portion of the top surface of the step molds 732. For further example, the peripheral sides of the top die 736 can be further out than the outer surfaces of the step molds 732 and form an overhang with a peripheral portion of the top die 736 over the substrate 702.

The integrated circuit packaging system 700 can have an encapsulation 742. The encapsulation 742 is a structure that encapsulates or surrounds components to prevent physical damage or corrosion. The encapsulation 742 can also hold the encapsulated components in place relative to each other. The encapsulation 742 can be made of materials such as ceramic, plastic, or epoxy. The encapsulation 742 can be on top of the substrate 702 and encapsulate the top die 736, the step molds 732, the package 726, the intermediate bond-wires 730, the integrated circuit die 704, or a combination thereof.

Referring now to FIG. 8, therein is shown a top plan view of the integrated circuit packaging system 700 in a fourth embodiment of the present invention. For illustrative purposes, the integrated circuit packaging system 700 is shown having the top die 736 of FIG. 7 and a top portion of the encapsulation 742 of FIG. 7 removed, and showing a line 7-7 for the cross-section view of FIG. 7.

The intermediate bond-wires 730 can electrically connect the package 726 directly to the integrated circuit die 704. The intermediate bond-wires 730 can relay signals between the integrated circuit die 704 and the package 726.

The top plan view also shows the integrated circuit die 704 having the step molds 732 covering an opposing pair of the peripheral sides 720 and exposing another pair. The peripheral sides 720 exposed by the step molds 732 can directly contact the encapsulation 742 of FIG. 7.

The integrated circuit packaging system 700 can have the package 726 attached offset to one of the peripheral sides 720. The package 726 can be offset to one of the peripheral sides 720 by being attached nearer to one of the peripheral sides 720 than others. As a specific example, the package 726 can be attached closer to one of the peripheral sides 720 not covered by the step molds 732. The intermediate bond-wires 730 can be over the peripheral side closest to the package 726.

For illustrative purposes, the step molds 732 are shown covering the entire length of the peripheral sides 720. However, it is understood that the step molds 732 can be configured differently. For example, the step molds 732 can cover only a portion of the peripheral sides 720. Also, for example, the step molds 732 can have gaps therein that expose portions of the peripheral sides 720.

Figure 9:
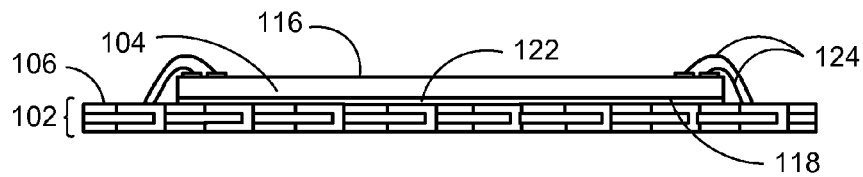
FIG. 9 is an arrangement of the substrate, the integrated circuit die, and bond wires for manufacturing the various embodiments of the present invention.

Referring now to FIG. 9, therein is shown an arrangement of the substrate 102, the integrated circuit die 104, and the bond wires 124 for manufacturing the various embodiments of the present invention. The substrate 102 can have the contact pads 110 of FIG. 1, the vias 114 of FIG. 1, the terminals 112 of FIG. 1, or a combination thereof.

The first adhesive layer 122 can be applied to the top surface 106 of the substrate 102. The integrated circuit die 104 can be placed on the first adhesive layer 122. The non-active side 118 of the integrated circuit die 104 can contact the first adhesive layer 122.

The bond wires 124 can be connected from the active side 116 of the integrated circuit die 104. The opposite end of the bond wires 124 can be connected to the contact pads 110, other pads on the substrate 102, or a combination thereof.

Figure 10:
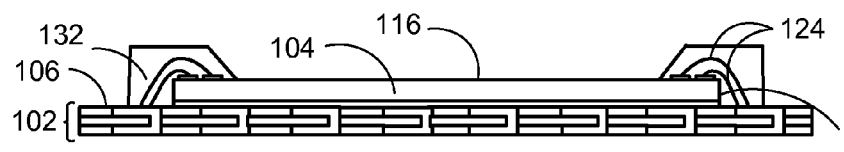
FIG. 10 is the structure of FIG. 9 with the step molds formed thereon.

Referring now to FIG. 10, therein is shown the structure of FIG. 9 with the step molds 132 formed thereon. The step molds 132 can be molded using a mold or a mold chase. The step molds 132 can be molded covering the peripheral sides 120 and portions of the active side 116.

The mold can be placed on the substrate 102 containing portions of the active side 116, the peripheral sides 120 and the bond wires 124. A molding material, such as epoxy or resin, can flow and be extruded through the mold. The molding material can set or harden, using a catalyst or light, to form the step molds 132. The mold can be removed after the step molds 132 have been formed.

Figure 11:
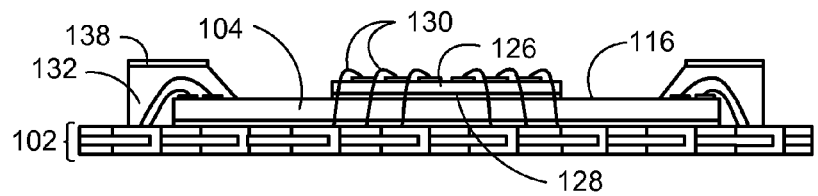
FIG. 11 is the structure of FIG. 10 with the intermediate die attached thereon.

Referring now to FIG. 11, therein is the structure of FIG. 10 with the intermediate die 126 attached thereon. The intermediate die 126 can be attached directly to the integrated circuit die 104 using the second adhesive layer 128.

The second adhesive layer 128 can be placed on the active side 116 of the integrated circuit die 104. The intermediate die 126 can be placed on top of the second adhesive layer 128. The intermediate bond-wires 130 can be connected to the top of surface of the intermediate die 126. The opposing end of the intermediate bond-wires 130 can be connected to the contact pads 110 of FIG. 1, the substrate 102, or a combination thereof. The third adhesive layer 138 can be placed on the top surface of the step molds 132.

Figure 12:
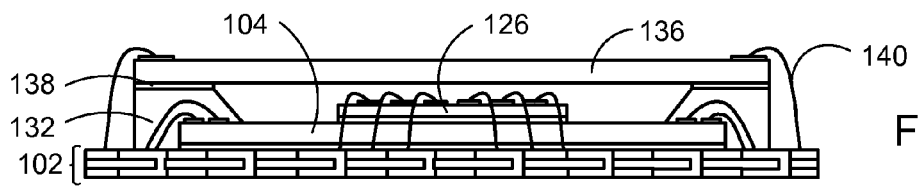
FIG. 12 is the structure of FIG. 11 with the top die attached thereon.

Referring now to FIG. 12, therein is shown the structure of FIG. 11 with the top die 136 attached thereon. The top die 136 can be placed on the third adhesive layer 138. Through the third adhesive layer 138, the top die 136 can be attached to the step molds 132. The top die can be directly over the intermediate die 126 and the integrated circuit die 104.

The top bond-wires 140 can be attached to the top surface of the top die 136. The opposite end of the top bond-wires 140 can be attached to the contact pads 110 of FIG. 1, the substrate 102, or a combination thereof.

Figure 13:
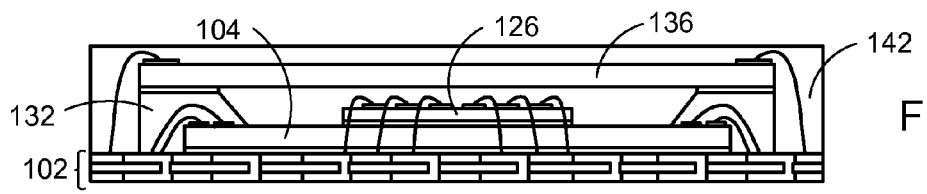
FIG. 13 is the structure of FIG. 12 encapsulated with the encapsulation.

Referring now to FIG. 13, therein is shown the structure of FIG. 12 encapsulated with the encapsulation 142. A mold can be placed over the substrate 102 covering the top die 136, the intermediate die 126, the integrated circuit die 104, the step molds 132, and other components.

A molding material, such as epoxy or resin, can flow and extruded through the mold. The molding material can flow through the gaps and surround the exposed wires and components. The molding material can set or harden, using a catalyst or light, to form the encapsulation 142. The mold can be removed after the encapsulation 142 has been formed.

Figure 14:
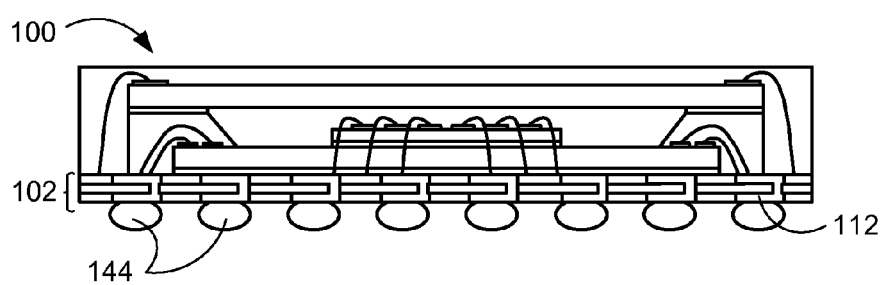
FIG. 14 is the structure of FIG. 13 with the solder bumps attached thereon.

Referring now to FIG. 14, therein is shown the structure of FIG. 13 with the solder bumps 144 attached thereon. Solder material, such as lead or RoHS compliant metal or alloy, can be heated and melted onto the terminal 112. The melted solder material can be allowed to cool to form the solder bumps 144.

Figure 15:
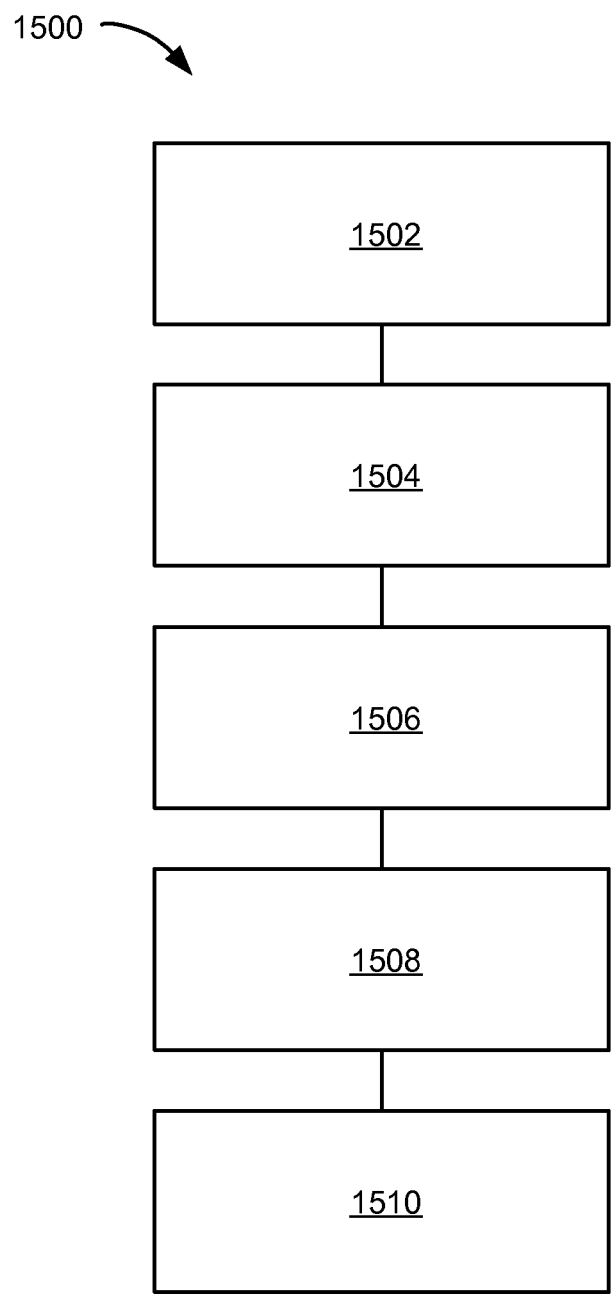
FIG. 15 is a flow chart of a method for manufacture of an integrated circuit packaging system in a further embodiment of the present invention.

Referring now to FIG. 15, therein is shown a flow chart of a method 1500 for manufacture of an integrated circuit packaging system 100 in a further embodiment of the present invention. The method 1500 includes providing a substrate in a block 1502; connecting an integrated circuit die to the substrate, with the integrated circuit die having peripheral sides in a block 1504; molding a step mold covering one of the peripheral sides and exposing the peripheral sides adjacent to the step mold in a block 1506; attaching an intermediate die directly over the integrated circuit die, offset to one of the peripheral sides exposed by the step mold in a block 1508; and directly connecting the intermediate die to the substrate in a block 1510.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   attaching an integrated circuit die to the substrate, the integrated circuit die having peripheral sides;
   connecting the integrated circuit die to the substrate with a first bond wire, the first bond wire disposed about one of the peripheral sides;
   molding a step mold covering one of the peripheral sides and the first bond wire;
   attaching an intermediate die directly over the integrated circuit die, offset to one of the peripheral sides adjacent to the step mold;
   directly connecting the intermediate die to the substrate with a second bond wire; and
   encapsulating the intermediate die, the integrated circuit die, the step mold, the second bond wire, and the substrate with an encapsulation, the encapsulation not contacting the first bond wire.

2. The method as claimed in claim 1 wherein:
   molding the step mold includes exposing the peripheral sides adjacent to the step mold; and
   attaching the intermediate die includes attaching the intermediate die offset to one of the peripheral sides exposed by the step mold.

3. The method as claimed in claim 1 further comprising directly connecting the intermediate die to the integrated circuit die.

4. A method of manufacture of an integrated circuit packaging system comprising:
   providing a substrate;
   attaching an integrated circuit die to the substrate, the integrated circuit die having peripheral sides
   connecting the integrated circuit die to the substrate with a bond wire, the bond wire disposed about one of the peripheral sides;
   molding a step mold covering one of the peripheral sides and encapsulating the bond wire;
   attaching an intermediate die directly over the integrated circuit die, offset to one of the peripheral sides adjacent to the step mold;
   directly connecting the intermediate die to the substrate with an intermediate bond wire;
   attaching a top die to the step mold and directly over the integrated circuit die and the intermediate die;
   connecting the top die to the substrate with a top bond wire; and
   encapsulating the top die, the intermediate die, the integrated circuit die, the step mold, the top bond wire, the intermediate bond wire, and the substrate with an encapsulation, the encapsulation not contacting the bond wire.

5. The method as claimed in claim 4 wherein attaching the intermediate die includes attaching a flip chip.

6. The method as claimed in claim 4 wherein attaching the intermediate die includes attaching a stack packaging.

7. An integrated circuit packaging system comprising:
a substrate;
an integrated circuit die attached to the substrate, the integrated circuit die having peripheral sides;
a bond wire operable to connect the integrated circuit die to the substrate, the bond wire disposed about one of the peripheral sides;
a step mold covering one of the peripheral sides and the bond wire;
an intermediate die attached directly over the integrated circuit die, offset to one of the peripheral sides adjacent to the step mold;
an intermediate bond wire operable to connect the intermediate die directly to the substrate; and
an encapsulation configured to encapsulate the intermediate die, the integrated circuit die, the step mold, the intermediate bond wire, and the substrate, the encapsulation not contacting the bond wire.

8. The system as claimed in claim 7 wherein:
the step mold exposes the peripheral sides adjacent to the step mold; and
the intermediate die is attached offset to one of the peripheral sides exposed by the step mold.

9. The system as claimed in claim 7 wherein the intermediate bond-wire is directly connected to the intermediate die and the integrated circuit die.

10. The system as claimed in claim 7 further comprising:
a top die attached to the step mold and directly over the integrated circuit die and the intermediate die;
a top bond wire operable to connect the top die directly to the substrate;
the encapsulation further configured to encapsulate the top die and the top bond wire.

11. The system as claimed in claim 10 wherein the intermediate die is a stack packaging.

* * * * *